US011094515B2

United States Patent
Suetsugu et al.

(10) Patent No.: US 11,094,515 B2
(45) Date of Patent: Aug. 17, 2021

(54) SPUTTERING APPARATUS AND SPUTTERING METHOD

(71) Applicant: Panasonic Intellectual Property Management Co., Ltd., Osaka (JP)

(72) Inventors: Daisuke Suetsugu, Osaka (JP); Masaaki Tanabe, Hyogo (JP); Akira Okuda, Osaka (JP); Yosimasa Takii, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 99 days.

(21) Appl. No.: 15/834,036

(22) Filed: Dec. 6, 2017

(65) Prior Publication Data

US 2018/0174808 A1 Jun. 21, 2018

(30) Foreign Application Priority Data

Dec. 19, 2016 (JP) .............................. JP2016-245787
Aug. 25, 2017 (JP) .............................. JP2017-162727

(51) Int. Cl.
*H01J 37/34* (2006.01)
*H01J 37/32* (2006.01)
(Continued)

(52) U.S. Cl.
CPC ...... *H01J 37/3476* (2013.01); *C23C 14/3485* (2013.01); *C23C 14/35* (2013.01);
(Continued)

(58) Field of Classification Search
CPC ............... H01J 37/3444; H01J 37/3476; H01J 37/3467; H01J 37/3402; H01J 37/32715;
(Continued)

(56) References Cited

U.S. PATENT DOCUMENTS 5,126,028 A * 6/1992 Hurwitt ................... C23C 14/04
                                                                  204/192.13
5,993,613 A * 11/1999 Manley ............... C23C 14/3492
                                                                  204/192.12
(Continued)

FOREIGN PATENT DOCUMENTS

CN        102822380      12/2012
JP       2010-512459     4/2010
(Continued)

OTHER PUBLICATIONS

English Translation of Chinese Search Report dated Nov. 26, 2020 for the related Chinese Patent Application No. 201711303507.4.

*Primary Examiner* — Michael A Band
(74) *Attorney, Agent, or Firm* — Wenderoth, Lind & Ponack, L.L.P.

(57) ABSTRACT

A sputtering apparatus has a vacuum chamber capable of arranging a target material and a substrate therein so as to face each other, a DC power supply capable of electrically being connected to the target material, and a pulsing unit pulsing electric current flowing in the target material from the DC power supply, in which plasma is generated in the vacuum chamber to form a thin film on the substrate, including an ammeter measuring electric current flowing in the pulsing unit from the DC power supply, a power supply controller performing feedback control of the DC power supply so that a current value measured by the ammeter becomes a prescribed value and a pulse controller indicating a pulse cycle shifted from a control cycle of the DC power supply by the power supply controller to the pulsing unit.

2 Claims, 7 Drawing Sheets

(51) Int. Cl.
  *C23C 14/34* (2006.01)
  *C23C 14/35* (2006.01)
  *C23C 14/50* (2006.01)
  *C23C 14/54* (2006.01)
  *C23C 14/06* (2006.01)
  *H01L 21/02* (2006.01)

(52) U.S. Cl.
  CPC .............. *C23C 14/50* (2013.01); *C23C 14/54* (2013.01); *H01J 37/32715* (2013.01); *H01J 37/3402* (2013.01); *H01J 37/3408* (2013.01); *H01J 37/3444* (2013.01); *H01J 37/3467* (2013.01); *C23C 14/0652* (2013.01); *H01L 21/02266* (2013.01)

(58) Field of Classification Search
  CPC .. H01J 37/3408; C23C 14/3485; C23C 14/54; C23C 14/35; C23C 14/0652; C23C 14/50
  See application file for complete search history.

(56) References Cited

U.S. PATENT DOCUMENTS

| | | | |
|---|---|---|---|
| 6,413,382 B1* | 7/2002 | Wang | H01J 37/3408 |
| | | | 204/192.12 |
| 8,585,873 B2* | 11/2013 | Ford | H01J 37/3455 |
| | | | 204/192.13 |
| 2006/0081459 A1* | 4/2006 | Tsai | C23C 14/35 |
| | | | 204/192.13 |
| 2013/0001075 A1 | 1/2013 | Morimoto et al. | |
| 2016/0111262 A1 | 4/2016 | Nakajima et al. | |
| 2016/0237554 A1 | 8/2016 | Kadlec et al. | |

FOREIGN PATENT DOCUMENTS

| | | |
|---|---|---|
| JP | 2010-116578 | 5/2010 |
| JP | 5490368 B | 5/2014 |
| JP | 2015-045031 | 3/2015 |
| JP | 2016-041842 | 3/2016 |
| WO | 2008/071734 | 6/2008 |

\* cited by examiner

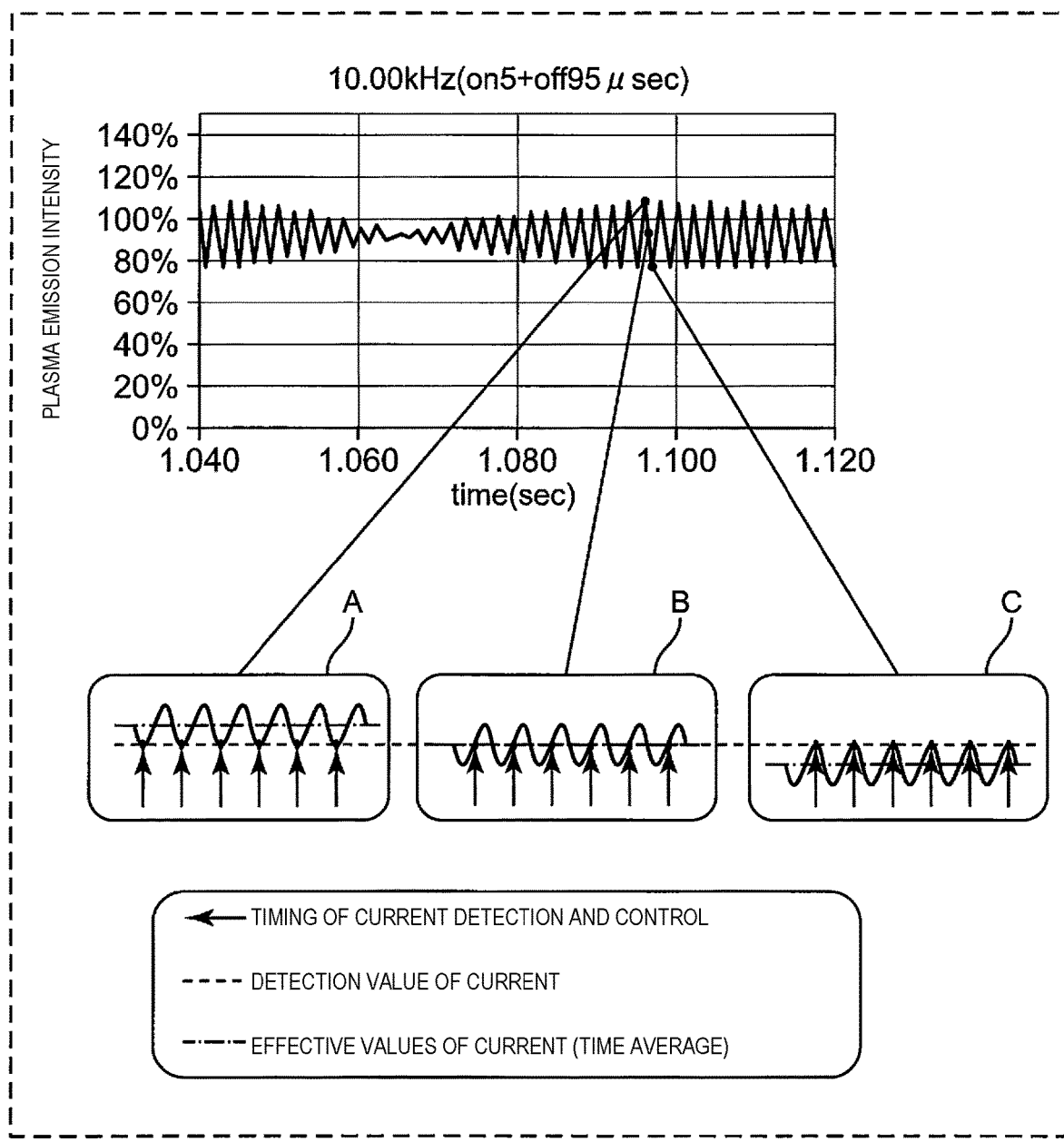

SPUTTERING APPARATUS AND SPUTTERING METHOD

TECHNICAL FIELD

The technical field relates to a sputtering apparatus and a sputtering method of depositing a film on a substrate such as a semiconductor wafer.

BACKGROUND

In manufacturing of semiconductor devices, a thin film of metal or oxide is formed on a substrate and is formed into a desired pattern to form electrodes, wiring, resistors, capacitors and so on. In recent years, necessity for a technique of forming a high-density or high-crystalline thin film is increasing. For example, the use environment of devices is becoming higher in temperature. Thus, higher density and so on are required for a passivation thin film for protecting devices.

In the formation of a thin film in a device, manufacture is generally performed by using DC sputtering, RF sputtering, etc. for reasons of production speed and production safety. For example, in a case where a compound thin film is formed by reactive sputtering, a target material to be raw material reacts with a reactant gas and is then deposited. However, sufficient reaction speed is not capable of being obtained depending on combination of the target material and the reactant gas. Particularly when forming a nitride film using a nitride gas, it is difficult to obtain a high-density or high-crystalline thin film by a general sputtering process.

There is also pulse sputtering in related art, as a film deposition means for forming a thin film with high density and high alignment (for example, refer to Japanese Patent No. 5490368 (Patent Literature 1).

A related-art pulse sputtering method will be explained mainly with reference to FIG. 6. Here, FIG. 6 is a schematic cross-sectional view of a related-art pulse sputtering apparatus. A vacuum chamber 1 can be decompressed by evacuating the chamber by a connected vacuum pump 2 through a valve 3 to be in a vacuum state. A gas supply source 4 can supply a gas necessary for sputtering to the vacuum chamber 1 at a constant speed. The valve 3 can control a degree of vacuum inside the vacuum chamber 1 to a desired gas pressure by changing an opening and closing rate thereof. A target material 7 is arranged inside the vacuum chamber 1. A backing plate 8 supports the target material 7. A power supply controller 40 is connected to a DC power supply 30 and is capable of controlling on/off of the power supply output at constant timing. An output of the DC power supply 30 is electrically connected to the backing plate 8, and part of the gas inside the vacuum chamber 1 is dissociated by applying a voltage to the target 7 through the backing plate 8, thereby generating plasma. A substrate 6 is arranged so as to face the target material 7 inside the vacuum chamber 1. The substrate holder 5 is arranged under the substrate 6 to support the substrate 6.

While the voltage application is on, the target material 7 is sputtered out by pulsed plasma generated inside the vacuum chamber 1 and reaches the substrate 6, thereby depositing a thin film of the target material 7. At the same time, the gas and plasma inside the vacuum chamber 1 react with the target material 7 being deposited on the substrate 6. Also, while the voltage application is off, the gas and plasma inside the vacuum chamber 1 react with the target material 7 deposited on the substrate 6, thereby forming a dense compound in which the target material 7 reacts with the gas. The series of pulse deposition is repeated for a prescribed number of times, thereby obtaining a highly-dense compound thin film.

In general, magnets 11 and a yoke 12 are arranged at the back of the target material 7, and plasma is concentrated in a position where a parallel magnetic field with respect to a flat surface of the target material 7 becomes maximum on the surface of the target material 7, thereby improving deposition speed. The position where the plasma is concentrated is called erosion. When the erosion is concentrated at a specific position, only part of the target material 7 is consumed and the material is not efficiently used, therefore, the magnets 11 and the yoke 12 may move in parallel to the target material 7 by a drive device to thereby move the erosion position, though not shown.

SUMMARY

In the above related-art sputtering apparatus (refer to FIG. 6), when a cycle of constant voltage control inside the DC power supply 30 and a cycle of pulse on/off timing are synchronized with each other, ripples in voltage are increased and discharge current varies. Therefore, it is difficult to deposit a film stably. When the erosion is moved by rotating the magnets 11, electric discharge is not stable due to uneven reaction between the material and the gas on the surface of the target material 7. Distribution of film quality inside the plane of the substrate 6 such as a density or a refractive index of a formed thin film is also deteriorated depending on the rotation cycle of the magnets 11. Furthermore, in film deposition for a long period of time, a positional relationship between the target material 7 and the substrate 6 changes with consumption of the target material 7. Therefore, there is a problem that the distribution of film quality inside the plane of the substrate 6 is deteriorated and the target material 7 requires replacement before being used up.

In view of the above related art problems, an object of the present disclosure is to provide a sputtering apparatus and a sputtering method capable of depositing a high-quality film stably.

A sputtering apparatus according to the present disclosure has a vacuum chamber capable of arranging a target material and a substrate therein so as to face each other, a DC power supply capable of electrically being connected to the target material, and a pulsing unit pulsing electric current flowing in the target material from the DC power supply, in which plasma is generated in the vacuum chamber to form a thin film on the substrate, including an ammeter measuring electric current flowing in the pulsing unit from the DC power supply, a power supply controller performing feedback control of the DC power supply so that a current value measured by the ammeter becomes a prescribed value and a pulse controller indicating a pulse cycle shifted from a control cycle of the DC power supply by the power supply controller to the pulsing unit.

A sputtering method according to the present disclosure is a method in which plasma is generated in a vacuum chamber to form a thin film on a substrate, which includes the steps of arranging a target material and the substrate so as to face each other in the vacuum chamber, electrically connecting the target material to a DC power supply, pulsing electric current flowing in the target material from the DC power supply through a pulsing unit, measuring electric current flowing in the pulsing unit from the DC power supply, performing feedback control of the DC power supply so that a measured current value becomes a prescribed value and indicating a pulse cycle shifted from a control cycle of the DC power supply to the pulsing unit.

As feedback control is performed so that the current value measured by the ammeter becomes a prescribed value by the sputtering apparatus and the sputtering method according to the present disclosure, electric discharge is stabilized. Variations in positional relationship between the erosion and the substrate are suppressed to the minimum even when the target material is consumed due to long time film deposition. Therefore, high and uniform film quality can be maintained and the high quality film can be stably deposited.

BRIEF DESCRIPTION OF THE DRAWINGS

FIG. 3A is a view showing variations in plasma emission intensity in a case where a pulse cycle and a control cycle of the DC power supply are synchronized in the sputtering apparatus, and variations in current values at that time;

DESCRIPTION OF EMBODIMENTS

Figure 1:
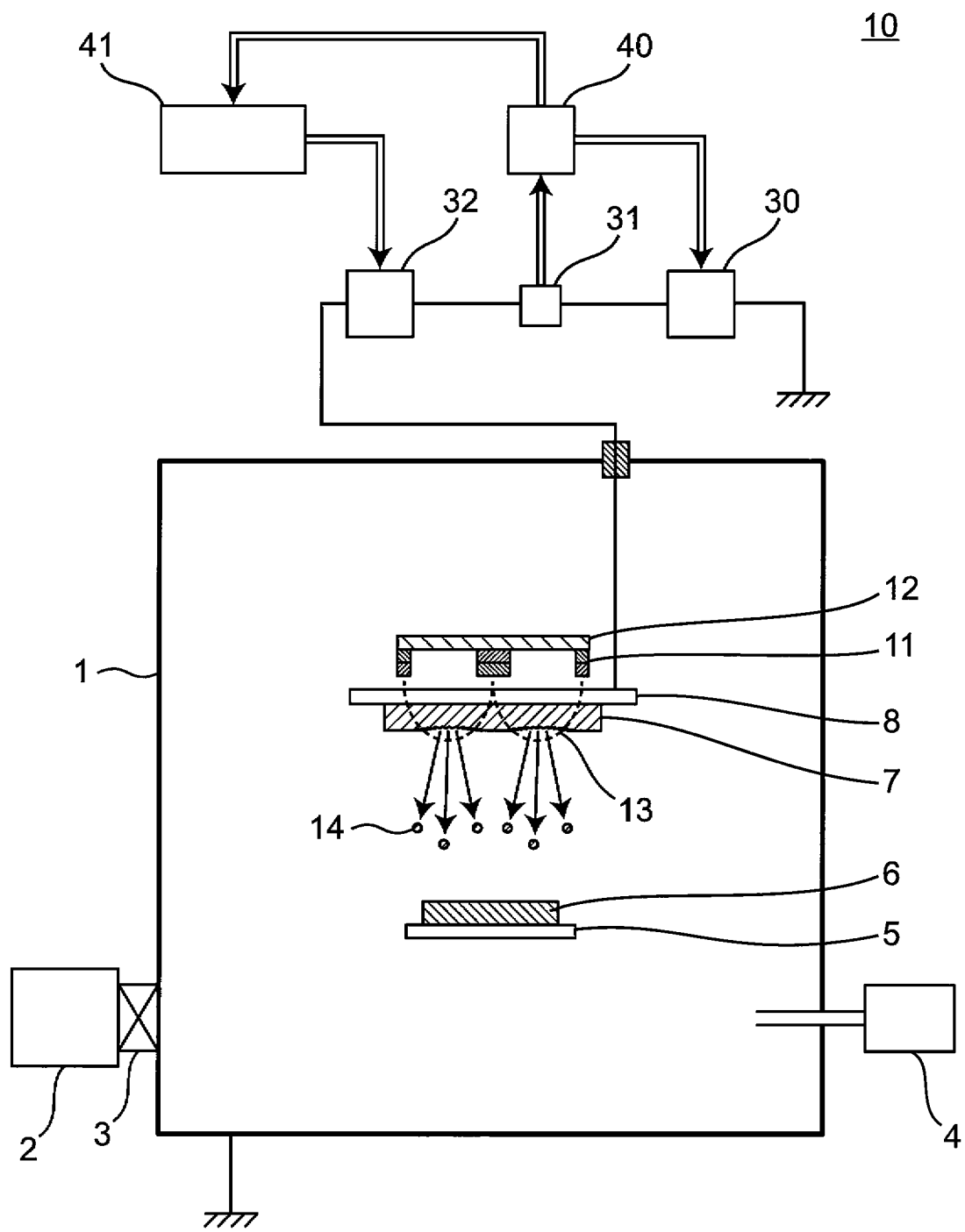
FIG. 1 is a schematic cross-sectional view showing a configuration of a sputtering apparatus according to Embodiment 1.

A sputtering apparatus according to a first aspect includes a vacuum chamber capable of arranging a target material and a substrate therein so as to face each other, a DC power supply capable of being electrically connected to the target material, and a pulsing unit pulsing electric current flowing in the target material from the DC power supply, in which plasma is generated in the vacuum chamber to form a thin film on the substrate, including an ammeter measuring electric current flowing in the pulsing unit from the DC power supply, a power supply controller performing feedback control of the DC power supply so that a current value measured by the ammeter becomes a prescribed value and a pulse controller indicating a pulse cycle shifted from a control cycle of the DC power supply by the power supply controller to the pulsing unit.

A sputtering apparatus according to a second aspect, according to the first aspect, may further include magnets arranged at the back of the target material that is an opposite side of a surface facing the substrate, a rotating mechanism rotating the magnets around a rotation shaft crossing the back of the target material, a rotation controller controlling the rotation mechanism, a lifting mechanism moving a position of the substrate upward and downward with respect to the target material so that an interval between the substrate and the target material is changed and a lifting controller controlling the lifting mechanism.

In a sputtering apparatus according to a third aspect, according to the first or second aspect, the pulse controller may calculate on-time and off-time so that, when a cycle of feedback control in the power controller is F1, a pulse cycle is F2 and a least common multiple of F1 and F2 is F3, an integer N obtained by N=F3÷F1 is 10 or more, and may indicate the value to the pulsing unit.

In a sputtering apparatus according to a fourth aspect, according to the first or second aspect, the pulse controller may calculate on-time and off-time so that the pulse cycle is shifted by 1% or more with respect to an integral multiple cycle of feedback control in the power supply controller and may indicate the value to the pulsing unit.

In a sputtering apparatus according to a fifth aspect, according to the second aspect, the pulse controller may calculate a rotation speed so that one cycle of rotation of the magnets is 1000 pulses or more based on set on-time and off-time of pulses and may indicate the rotation speed to the rotation controller, and further, the pulse controller may calculate a movement amount allowing a position of the substrate to be close to the target material based on information of a consumption amount of the target material with respect to a number of pulses obtained in advance and may indicate the movement amount to the lifting controller.

A sputtering method according to a sixth aspect is a method in which plasma is generated in a vacuum chamber to form a thin film on a substrate, which includes the steps of arranging a target material and the substrate so as to face each other in the vacuum chamber, electrically connecting the target material to a DC power supply, pulsing electric current flowing in the target material from the DC power supply through a pulsing unit, measuring electric current flowing in the pulsing unit from the DC power supply, performing feedback control of the DC power supply so that a measured current value becomes a prescribed value and indicating a pulse cycle shifted from a control cycle of the DC power supply to the pulsing unit.

Hereinafter, a sputtering apparatus and a sputtering method according to embodiments will be explained with reference to the drawings. In the drawings, the same symbols are given to substantially the same components.

Embodiment 1

First, a configuration of a sputtering apparatus 10 according to Embodiment 1 will be explained mainly with reference to FIG. 1. FIG. 1 is a schematic cross-sectional view of the sputtering apparatus 10 according to Embodiment 1.

The sputtering apparatus 10 includes a vacuum chamber 1, a DC power supply 30, a pulsing unit 32, an ammeter 31, a power supply controller 40 and a pulse controller 41. In the vacuum chamber 1, a target material 7 and a substrate 6 can be arranged therein so as to face each other. The DC power supply 30 can be electrically connected to the target material 7. Electric current flowing from the DC power supply 30 to the target material 7 can be pulsed by the pulsing unit 32. Electric current flowing from the DC power supply 30 to the pulsing unit 32 is measured by the ammeter 31. The DC power supply 30 is feedback-controlled by the power supply controller 40 so that a current value measured by the ammeter 31 becomes a prescribed value. The pulse controller 41 indicates a pulse cycle shifted from a control cycle of the DC power supply 30 by the power supply controller 40 to the pulsing unit 32.

According to the sputtering apparatus 10, electric current pulsed in the pulse cycle shifted from the cycle of feedback control of the DC power supply 30 is allowed to flow in the target material 7. Accordingly, as the cycle of current detection does not correspond to the pulse cycle in the feedback control, a specific position of pulsation in DC current values of the DC power supply is not detected. Therefore, a correct time-averaged current value can be calculated by taking an average value of detected current values. Accordingly, variations in plasma intensities can be suppressed by performing feedback control of the DC power supply based on the calculated current value.

Respective components configuring the sputtering apparatus 10 will be explained below.

[Vacuum Chamber]

The vacuum chamber 1 can be decompressed into the vacuum state by performing evacuation by the vacuum pump 2 connected through the valve 3.

[Gas Supply Source]

A gas supply source 4 can supply a gas necessary for sputtering to the vacuum chamber 1 at a constant speed. As the gas supplied by the gas supply source 4, for example, a gas having reactivity with a target material such as nitrogen and oxygen, a mixed gas of the gas having reactivity and a noble gas such as argon and so on can be selected.

[Valve] An opening and closing rate of the valve 3 is changed, thereby controlling a degree of vacuum inside the vacuum chamber 1 to a desired gas pressure.

[Target Material]

In FIG. 1, the target material 7 is arranged at an upper part inside the vacuum chamber 1. The target material 7 is an arbitrary sputtering material, which is for example, an organic material such as a metal material or a semiconductor material.

[Backing Plate]

A backing plate 8 supports the target material 7.

[DC Power Supply]

The DC power supply 30 is electrically connected to the target material 7 through the ammeter 31, the pulsing unit 32 and the backing plate 8, which can apply a voltage to the target material 7.

[Pulsing Unit]

The pulsing unit 32 stores DC current generated by the DC power supply 30 in a capacitor and the like included therein and is turned on/off by a semiconductor switching device or the like included therein to thereby pulse the DC current.

[Ammeter]

The ammeter 31 is capable of detecting electric current flowing from the DC power supply 30 to the pulsing unit 32.

[Power Supply Controller]

The power supply controller 40 is connected to the ammeter 31 and the DC power supply 30 and is capable of performing feedback control of a voltage set value of the DC power supply so that the current value detected by the ammeter 31 becomes stable in a prescribed value.

[Pulse Controller]

The pulse controller 41 is connected to the power controller 40 and the pulsing unit 32, controlling on-time and off-time of pulses to be indicated to the pulsing unit 32 based on the status of the DC current power supply 30 obtained from the power supply controller 40.

[Magnets and Yoke]

Magnets 11 and a yoke 12 are arranged at the back of the backing plate 8 and are capable of generating magnetic fields 13 on the surface of the target material 7. At least one or more magnets 11 are preferably provided. The magnets 11 may be either of permanent magnets and electromagnets. The yoke 12 is connected to one end of the magnets 11, which configures a magnetic circuit to thereby suppress unnecessary leakage of magnetic fields to the opposite side of the target material 7.

[Substrate and Substrate Holder]

In FIG. 1, the substrate 6 is arranged so as to face the target material 7 in a lower part of the vacuum chamber 1. A substrate holder 5 is arranged under the substrate 6 to support the substrate 6.

(Operation of Sputtering Apparatus)

Next, the operation of the sputtering apparatus 10 according to Embodiment 1 will be explained and a sputtering method according to Embodiment 1 will be also explained (the same applies to another Embodiment 2).

(1) First, the target material 7 is set in the vacuum chamber 1 and the substrate 6 is set under the target material 7 horizontally.

(2) Next, the vacuum pump 2 is operated to decompress the inside of the vacuum chamber 1 to be in the vacuum state. After reaching a predetermined degree of vacuum, a gas is introduced from the gas supply source 4 and an aperture of a gate valve 3 is adjusted so that the gas has a predetermined gas pressure.

(3) Subsequently, a voltage is generated by the DC power supply 30 and pulsed by being switched in prescribed on-time and off-time by the pulsing unit 32. The voltage is applied to the target material 7, thereby generating plasma inside the vacuum chamber 1.

[Pulse Generation State]

Figure 2:
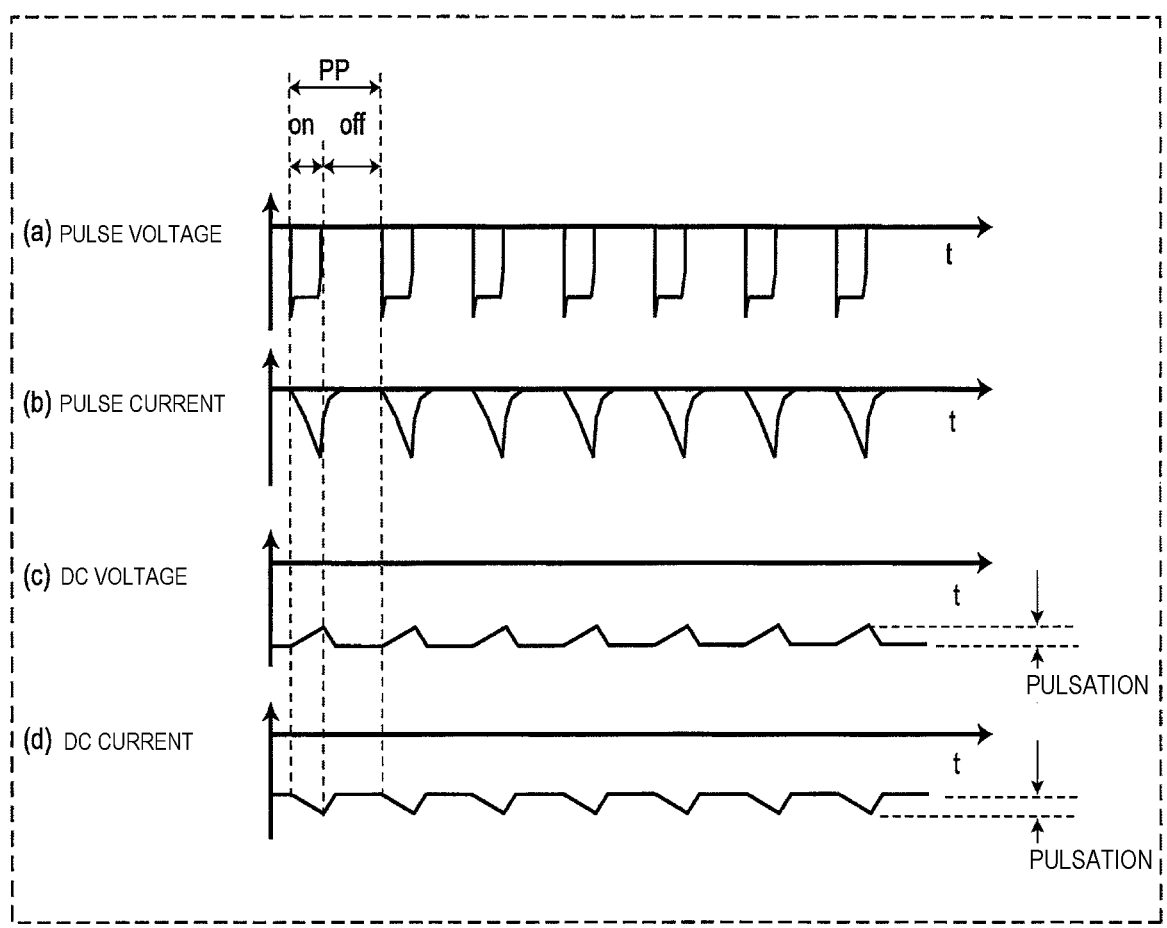
FIG. 2 shows timing charts indicating the relation between voltage values/current values of a DC power supply and pulse voltage/pulse current in the sputtering apparatus according to Embodiment 1.

A pulse generation state of pulses will be explained with reference to timing charts of FIG. 2. In (a) to (d) of FIG. 2 are timing charts showing the relation between voltage values ((a) of FIG. 2)/current values ((b) of FIG. 2) of the DC power supply and pulse voltage ((c) of FIG. 2)/pulse current ((d) of FIG. 2) in the sputtering apparatus according to Embodiment 1. Negative DC voltage and DC current are supplied from the DC power supply 30 to the pulsing unit 32 ((c), (d) of FIG. 2). A pulse voltage generated by the pulsing unit has a pulse shape close to a rectangular shape in which given on-time and off-time are repeated ((a) of FIG. 2). Plasma is generated by the application of the pulse voltage and the pulse current is gradually increased during a period of pulse on-time, and the pulse current is gradually reduced in a process of extinguishment of plasma during a period of the pulse off-time and becomes 0 (zero) ((b) of FIG. 2). At that time, as the DC power supply 30 supplies electric current to be consumed by the pulsing unit 32, the voltage value of the DC power supply 30 drops in a positive direction and pulsates ((c) of FIG. 2). On the other hand, the current value of the DC power supply 30 pulsates in a direction of increasing in a negative direction ((d) of FIG. 2). That is, pulsation corresponding to the pulse cycle occurs in the DC voltage and the DC current of the DC power supply 30. The ammeter 31 detects pulsating current values at constant cycles, the power supply controller 40 averages detected current values predetermined times, and performing feedback control of the DC power supply 30 so that an average current value becomes a prescribed value.

When the feedback control of the DC power supply 30 is performed in the sputtering apparatus, the pulse cycle is set to values shifted from values of the cycle of feedback control so that the cycle of feedback control of the DC power supply 30 is not synchronized with the pulse cycle. In order to shift the pulse cycle, for example, pulse on-time or pulse off-time is slightly extended. As rising of the pulse current is changed when the on-time is changed, it is desirable to change pulse off-time. In a case where the cycle of feedback control is F1, the pulse cycle is F2 and a least common multiple of F1 and F2 is F3, an integer N obtained by N=F3÷F1 represents that the feedback control corresponds to the pulse cycle once every N-times. N is desirably 10 or more, that is, a ratio in which the cycles correspond to each other is once in 10 times or less. In a case where the pulse becomes large current and current variations are large due to difference of sputtering materials or at the time of high-speed deposition, N is preferably 20 or more for further suppressing variations. As time to be shifted for obtaining a cycle satisfying the above N, specifically, the pulse cycle is desirably shifted by 1% or more, and more desirably, the pulse cycle is shifted by 5% or more to obtain an effect of suppressing variations. When the pulse cycle is shifted by a nice round number such as 100% or 200%, the pulse cycle will be an integral multiple, and the ratio in which cycles correspond to each other will be the same as the ratio before being shifted, thus it is desirable to avoid such number.

[Feedback Control]

Feedback control of the DC power supply 30 in which a pulse frequency is shifted will be explained with reference to FIG. 3A and FIG. 3B.

FIG. 3A is a view showing variations in plasma emission intensity in a case where 10 kHz of the pulse cycle and 10 kHz of the cycle of feedback control of the DC power supply are synchronized. In FIG. 3A, an observation interval of plasma emission intensities is 100 times longer or more than the pulse cycle, therefore, variations in average intensities of 100 or more pulses are observed. Inside of balloons A, B and C are views showing variations of DC current values in (d) of FIG. 2. The balloons A, B and C have the same detection cycles respectively, however, timing of detection is shifted from one another. Accordingly, current values to be detected in the balloons A, B and C are different from one another even when they have the same current waveforms. In this case, the detection cycle in the ammeter 31 is not the same as the pulse cycle but is almost synchronized with the pulse cycle, therefore, specific positions of pulsation in current values that are respectively different from one another are detected as shown in view of the balloons A, B and C. When feedback control is performed based on the above, an average value of detected current values is deviated from an average value of actual current values. This deviation gradually changes with time by a difference cycle between the pulse cycle and the cycle of feedback control as shown by another balloon view. Accordingly, pulsation is increased by feedback control, plasma is difficult to stabilize. and the plasma emission intensity fluctuates greatly, as shown in the drawing.

Figure 3B:
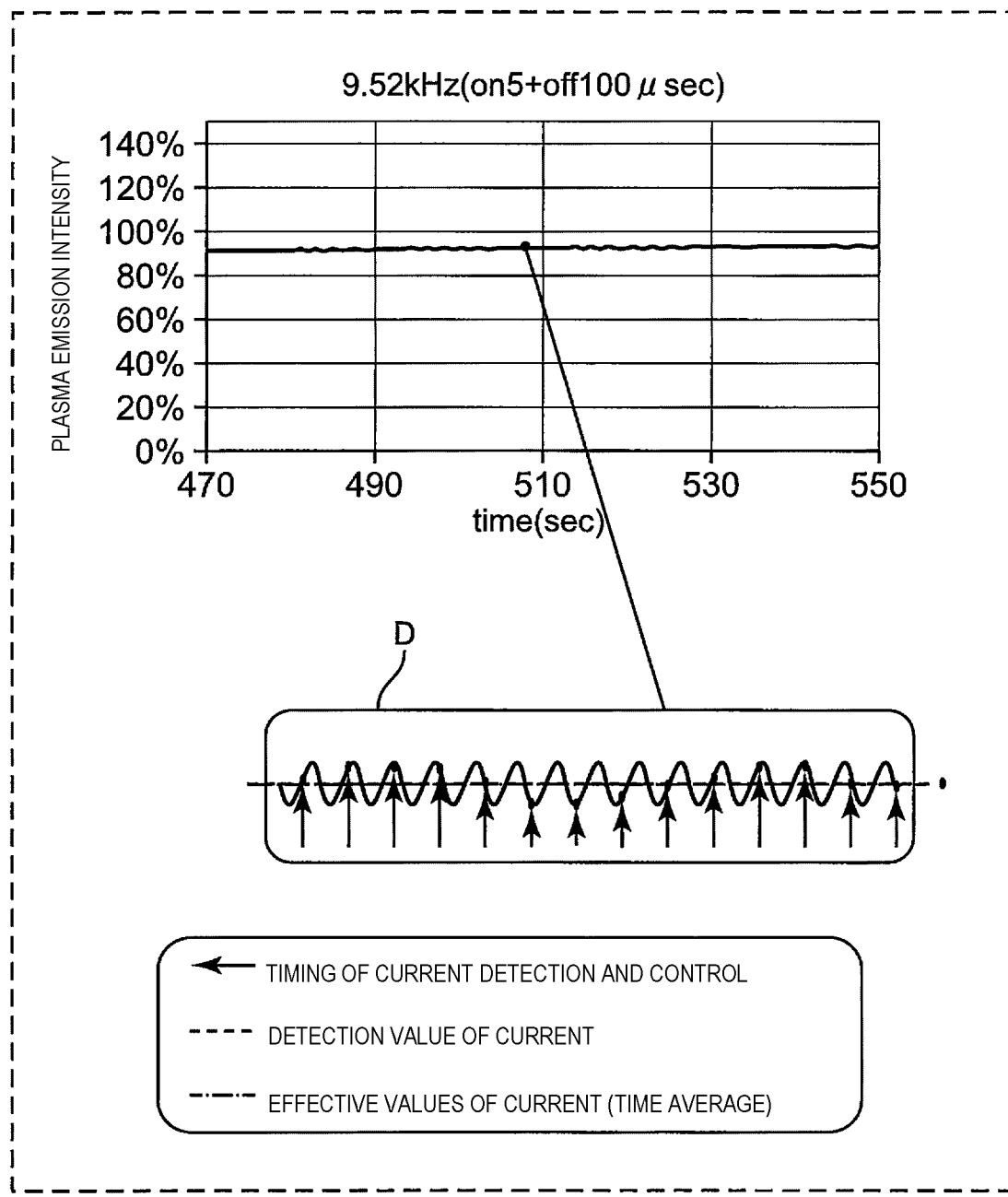
FIG. 3B is a view showing variations in plasma emission intensity in a case where the pulse cycle and a cycle of feedback control of the DC power supply are shifted, and variations in current values at that time.

FIG. 3B is a view showing variations in plasma emission intensity in a case where the pulse cycle and the cycle of feedback control of the DC power supply are shifted by 5%. In this case, the cycle of current detection corresponds to the pulse cycle once in 21 times in the feedback control. Therefore, a ratio in which specific positions of pulsation in DC current values of the DC power supply are detected is reduced. An average value of detected current values is taken, thereby calculating a more correct current value of time average. When the pulse cycle is shifted by 1% or more with respect to the cycle of feedback control and the DC power supply is feedback-controlled based on the calculated current values as described above, variations in plasma intensity are suppressed, as shown in FIG. 3B.

As described above, the target material 7 is sputtered out by pulsed plasma generated inside the vacuum chamber 1 and reaches the substrate 6, thereby depositing a thin film of the target material 7. At the same time, the gas and plasma inside the vacuum chamber 1 react with the target material 7 being deposited on the substrate. Also, while the voltage application is off, the gas and plasma inside the vacuum chamber 1 react with the target material 7 deposited on the substrate 6, thereby forming a dense compound in which the target material 7 reacts with the gas. The series of pulse deposition is repeated for a prescribed number of times, thereby obtaining a highly-dense compound thin film According to the above, feedback control of current values measured by the ammeter is stabilized in the pulse sputtering apparatus 10, therefore, variations in voltage and current of plasma discharge can be suppressed. Accordingly, a sputtering speed of the target material 7 by plasma, namely, a deposition speed of the target material to the substrate 6 can be fixed without variations. Accordingly, reaction between the gas/plasma and the target material deposited on the substrate 6 can be also fixed without variations, therefore, a high-quality film can be stably deposited.

Second Embodiment 2

Next, a configuration of a sputtering apparatus 10a according to Embodiment 2 will be explained mainly with reference to FIG. 4.

Figure 4:
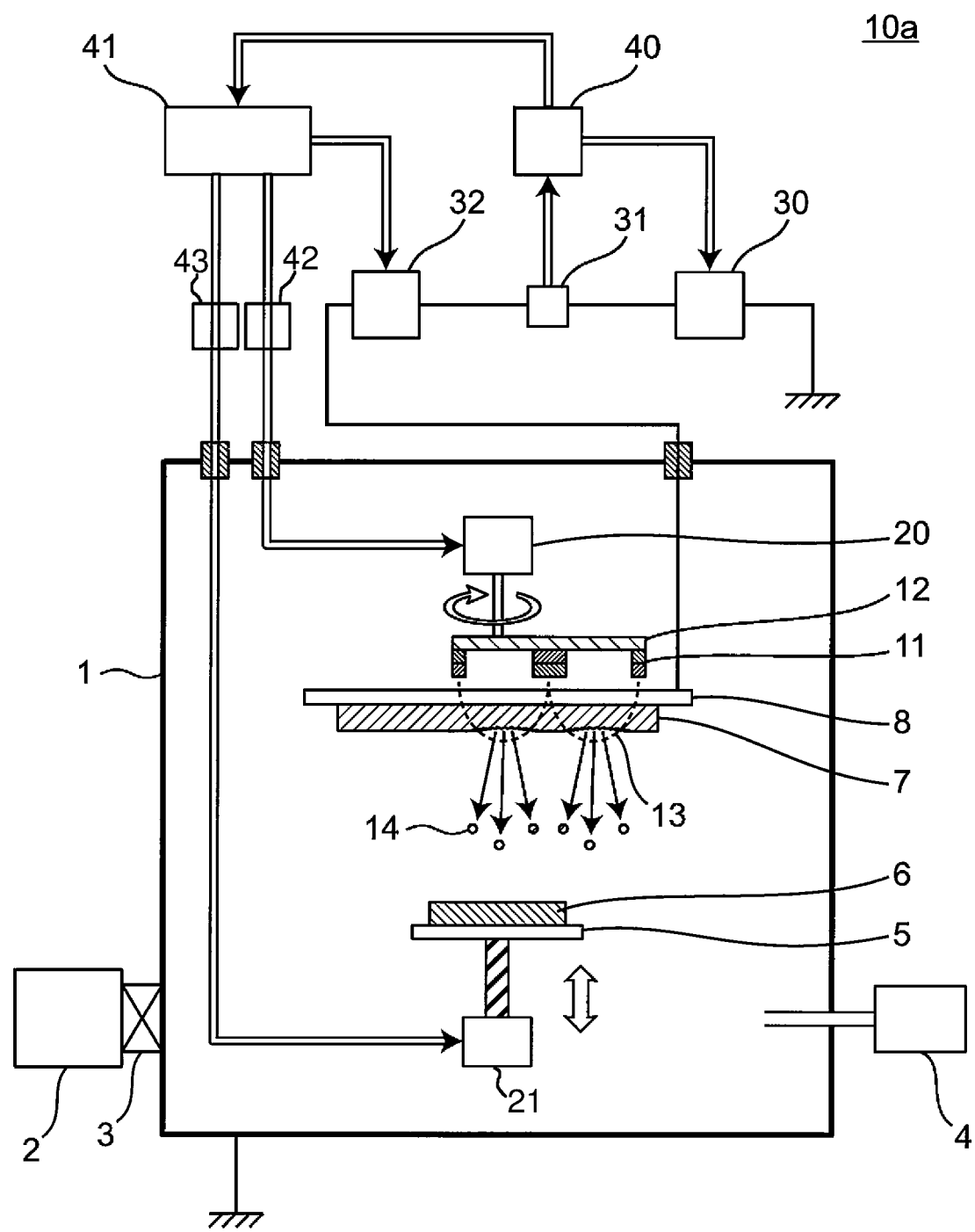
FIG. 4 is a schematic cross-sectional view showing a configuration of a sputtering apparatus according to Embodiment 2.

Here, FIG. 4 is a schematic cross-sectional view showing a configuration of the sputtering apparatus 10a according to Embodiment 2. Concerning FIG. 4, the same symbols are given to portions that are the same as or correspond to portions shown in FIG. 1 and part of explanation is omitted.

In FIG. 4, the magnets 11 and the yoke 12 are arranged on the back side of the backing plate 8. Comparing the sputtering apparatus 10a with the sputtering apparatus 10 according to Embodiment 1, the sputtering apparatus 10a differs in one point in that a rotating mechanism 20 is connected to the yoke 12 at an eccentric position so that the magnets 11 and the yoke 12 can be eccentrically rotated. Moreover, a rotation controller 42 is connected to the rotating mechanism 20 so that the rotation of the rotating mechanism 20 can be controlled in accordance with setting. The pulse controller 41 is also connected to the rotation controller 42, thereby performing setting to a given rotation speed by receiving an indicated value of rotation.

Furthermore, the sputtering apparatus 10a differs from the sputtering apparatus according to Embodiment 1 in one point in that a lifting mechanism. 21 is connected to the substrate holder 5 so that a facing distance between the target material 7 and the substrate 6 can be changed. A lifting controller 43 is connected to the lifting mechanism 21 so that lifting/lowering positions of the lifting mechanism 21 can be controlled in accordance with setting. The pulse controller 41 is also connected to the lifting controller 43, thereby performing setting to a given lifting/lowering speed by receiving an indicated value of lifting/lowering.

As an erosion moves on the target surface by eccentrically rotating the magnets 11, a consumption amount of the target material 7 is not concentrated on part of the surface of the target material 7. When an integrated number of pulses is increased in a case where film deposition is continuously performed on the substrate 6 for a long period of time or in a case where film deposition is repeated on the substrate 6, the consumption amount on the surface of the target material 7 is increased. For example, a consumption amount may reach 4 mm when a thickness of the target material 7 is 5 mm. In that case, a distance from the erosion position on the surface of the target material 7 to the facing substrate 6 is increased by a consumption amount as compared with a distance before the target material 7 is consumed. Energy obtained when sputtered particles 14 sputtered out from the surface of the target material 7 reach the substrate is reduced, and as a result a high quality film is not obtained in some cases.

Figure 5:
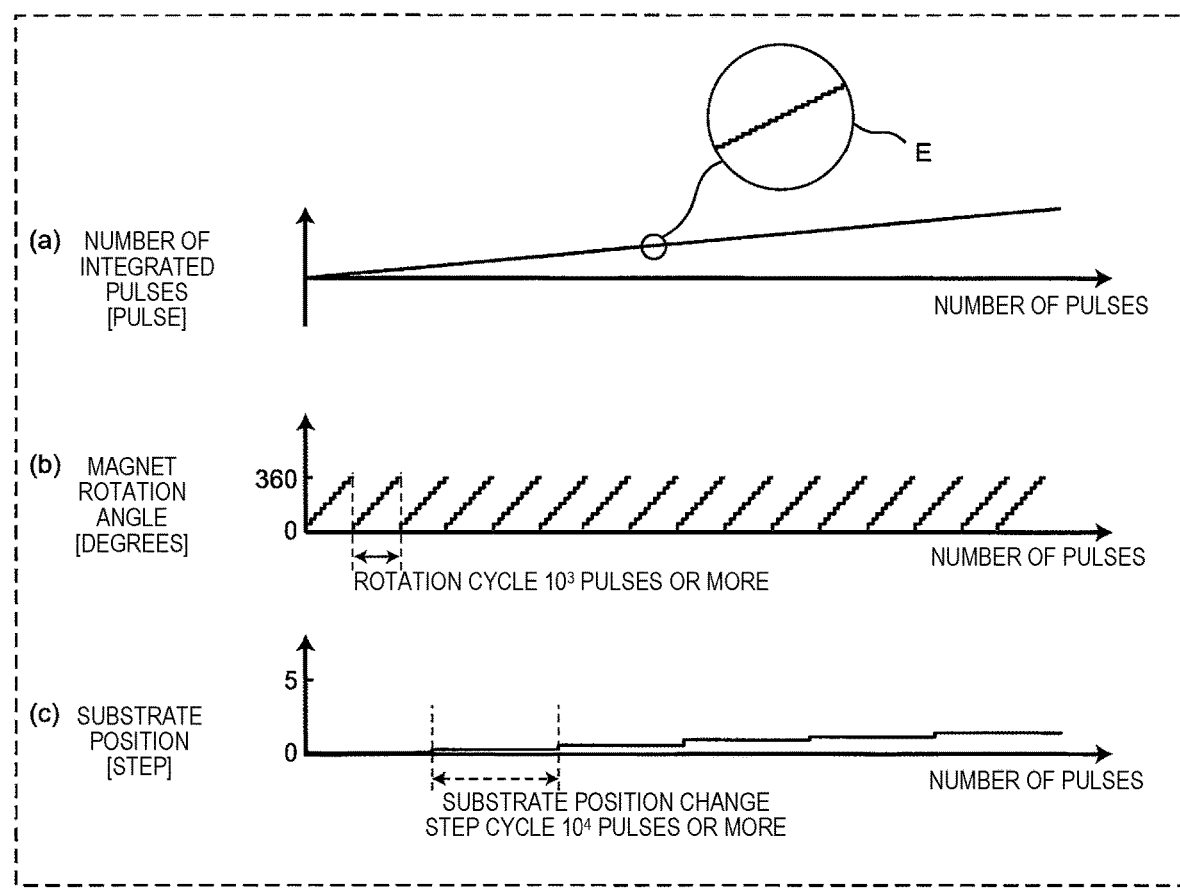
FIG. 5 shows timing charts indicating the relation between a number of integrated pulses, a magnet rotation angle and a substrate position with respect to a number of pulses in the sputtering apparatus according to Embodiment 2.
Figure 6:
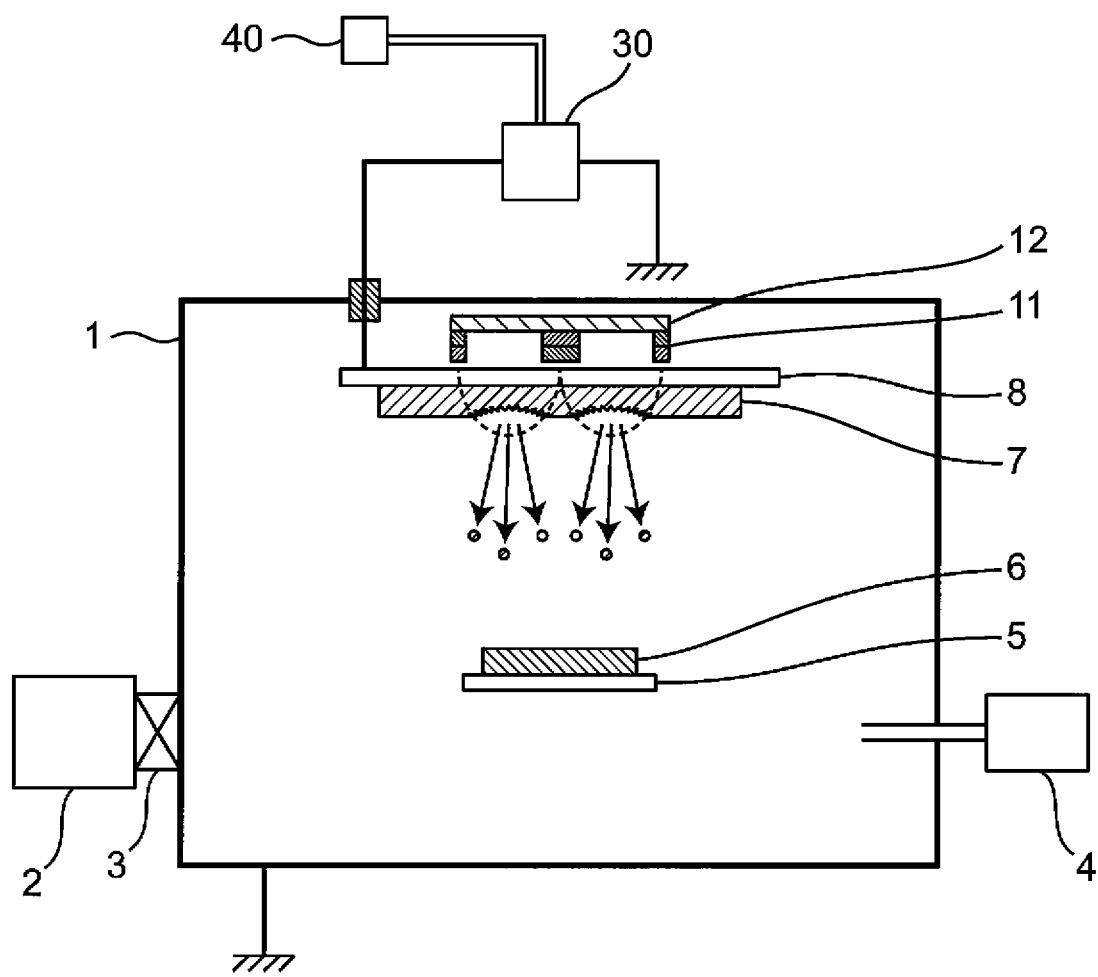
FIG. 6 is a cross-sectional view showing a related-art pulse sputtering apparatus.

Steps of controlling pulses, rotation of the magnets and the lifting/lowering of the substrate 6 in Embodiment 2 will be explained with reference to FIG. 5. FIG. 5 shows timing charts indicating the relation of pulses, the rotation of the magnets 11 and the lifting/lowering of the substrate 6 in the sputtering apparatus 10*a* according to Embodiment 2. In (a) of FIG. 5 is a timing chart showing the relation between a number of integrated pulses and a number of pulses. In (b) of FIG. 5, is a timing chart showing the relation between a rotation angle of the magnets and a number of pulses. In (c) of FIG. 5, is a timing chart showing the relation between a substrate position by lifting/lowering of the substrate and a number of pulses.

The pulse controller 41 sets on-time and off-time of pulses in the pulsing unit 32 as well as integrates the executed number of pulses ((a) of FIG. 5). The pulse controller 41 calculates a rotation speed so that one cycle of rotation of the magnets 11 is the time of 1000 pulses or more based on set values of on-time and off-time of pulses, and indicates the calculated rotation speed to the rotation controller ((b) of FIG. 5). Accordingly, when the target material 7 is sputtered by pulsed plasma, the surface of the target material 7 can be uniformly sputtered. Accordingly, sputter deposition can be stably performed even in long-time film deposition without consuming the surface of the target material 7 unevenly.

Furthermore, at the time of continuing film deposition for a long time, the pulse controller 41 calculates a movement amount for allowing the position of the substrate 6 to be close to the target 7 based on information of the consumption amount of the target material 7 with respect to a number of pulses experimentally obtained in advance and indicates the calculated value to the lifting controller 43 ((c) of FIG. 5). Accordingly, positional relationship of the substrate 6 facing the erosion on the surface of the target material 7 is maintained while evenly sputtering the surface of the target material 7 by the rotation of the magnets 11. Even in the long time deposition, a homogeneous thin film can be deposited stably.

According to the above, feedback control is performed in the pulse sputtering apparatus 10*a* so that the time average value of current values measured by the ammeter becomes a prescribed value, therefore, electric discharge is stabilized. Even when the target material 7 is consumed due to the long time deposition, variations in positional relationship between the erosion and the substrate 6 are suppressed to a minimum. Therefore, high and uniform film quality can be maintained, and the high quality film can be deposited stably for a long period of time.

In the present disclosure, arbitrary embodiments and/or examples may be suitably combined in the above various embodiments and examples, thereby obtaining effects contained in respective embodiments and examples.

The sputtering apparatus and the sputtering method according to the present disclosure are capable of stably forming a silicon nitride thin film with a high density, which is useful for forming a high-quality passivation thin film in manufacture of thin-film devices.

What is claimed is:

1. A sputtering apparatus comprising:
   a vacuum chamber accommodating a target material and a substrate therein so as to face each other;
   a DC power supply electrically connected to the target material;
   a pulsing unit configured to pulse electric current flowing in the target material from the DC power supply, in which plasma is generated in the vacuum chamber to form a thin film on the substrate;
   an ammeter configured to measure electric current flowing in the pulsing unit from the DC power supply;
   a power supply controller configured to perform feedback control in a feedback control cycle of a voltage set value of the DC power supply;
   a pulse controller configured to indicate to the pulsing unit a pulse cycle that is shifted from the feedback control cycle of the DC power supply by the power supply controller so that the feedback control cycle is not synchronized with the pulse cycle and so that the pulse cycle that is shifted flows in the target material;
   magnets arranged at a back area of the target material that is an opposite side of a surface facing the substrate;
   a rotating mechanism configured to rotate the magnets around a rotation shaft crossing the back area of the target material;
   a rotation controller configured to control the rotating mechanism;
   a lifting mechanism configured to move a position of the substrate upward and downward with respect to the target material so that an interval between the substrate and the target material is changed; and
   a lifting controller configured to control the lifting mechanism,
   wherein the feedback control in the feedback control cycle is performed in the sputtering apparatus so that a time average value of current values measured by the ammeter is a prescribed value that is indicated to the pulsing unit,
   wherein the pulse controller is configured to calculate on-time and off-time of pulses of the pulse cycle indicated to the pulsing unit so that, when the feedback control cycle in the power supply controller is F1, the pulse cycle is F2 and a least common multiple of F1 and F2 is F3, an integer N obtained by N=F3÷F1 is 10 or more,
   wherein the pulse controller is configured to calculate a rotation speed so that one cycle of rotation of the magnets is 1000 pulses or more based on the calculated on-time and off-time of pulses and indicates the rotation speed to the rotation controller, and
   the pulse controller is configured to calculate a movement amount allowing the position of the substrate to be close to the target material and indicates the movement amount to the lifting controller to move the substrate towards the target material.

2. A sputtering apparatus comprising:
   a vacuum chamber accommodating a target material and a substrate therein so as to face each other;
   a DC power supply electrically connected to the target material;
   a pulsing unit configured to pulse electric current flowing in the target material from the DC power supply, in which plasma is generated in the vacuum chamber to form a thin film on the substrate;
   an ammeter configured to measure electric current flowing in the pulsing unit from the DC power supply;
   a power supply controller configured to perform feedback control in a feedback control cycle of a voltage set value of the DC power supply;

a pulse controller configured to indicate to the pulsing unit a pulse cycle that is shifted from the feedback control cycle of the DC power supply by the power supply controller so that the feedback control cycle is not synchronized with the pulse cycle and so that the pulse cycle that is shifted flows in the target material;

magnets arranged at a back area of the target material that is an opposite side of a surface facing the substrate;

a rotating mechanism configured to rotate the magnets around a rotation shaft crossing the back area of the target material;

a rotation controller configured to control the rotating mechanism;

a lifting mechanism configured to move a position of the substrate upward and downward with respect to the target material so that an interval between the substrate and the target material is changed; and a lifting controller configured to control the lifting mechanism, wherein the feedback control in the feedback control cycle is performed in the sputtering apparatus so that a time average value of current values measured by the ammeter is a prescribed value that is indicated to the pulsing unit, wherein the pulse controller is configured to calculate on-time and off-time of pulses of the pulse cycle indicated to the pulsing unit so that the pulse cycle is shifted by 1% or more with respect to an integral multiple cycle of the feedback control in the feedback control cycle in the power supply controller, wherein the pulse controller is configured to calculate a rotation speed so that one cycle of rotation of the magnets is 1000 pulses or more based on the calculated on-time and off-time of pulses and indicates the rotation speed to the rotation controller, and the pulse controller is configured to calculate a movement amount allowing the position of the substrate to be close to the target material and indicates the movement amount to the lifting controller to move the substrate towards the target material.

* * * * *